(12) United States Patent
Hashido et al.

(10) Patent No.: US 7,209,057 B2
(45) Date of Patent: Apr. 24, 2007

(54) DECODE CIRCUITRY AND A DISPLAY DEVICE USING THE SAME

(75) Inventors: Ryuichi Hashido, Chiyoda-ku (JP); Hiroyuki Murai, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/376,136

(22) Filed: Mar. 16, 2006

(65) Prior Publication Data
US 2006/0232450 A1    Oct. 19, 2006

(30) Foreign Application Priority Data
Apr. 19, 2005 (JP) ............................. 2005-121370

(51) Int. Cl.
*H03M 5/02* (2006.01)
(52) U.S. Cl. .......................................... 341/56; 341/50
(58) Field of Classification Search ............. 341/50–70
See application file for complete search history.

(56) References Cited
U.S. PATENT DOCUMENTS
6,072,410 A * 6/2000 Kim ............................ 341/59

FOREIGN PATENT DOCUMENTS

| | | |
|---|---|---|
| JP | 2000-66642 | 3/2000 |
| JP | 2000-183747 | 6/2000 |
| JP | 2000-242209 | 9/2000 |
| JP | 2001-133754 | 5/2001 |
| JP | 2003-29687 | 1/2003 |
| JP | 2003-241716 | 8/2003 |

\* cited by examiner

*Primary Examiner*—Rexford Barnie
*Assistant Examiner*—Lam T. Mai
(74) *Attorney, Agent, or Firm*—Oblon, Spivak, McClelland, Maier & Neustadt, P.C.

(57) ABSTRACT

Multi-bit input data is divided into at least a first bit group and a second bit group, and each of first sub-decode circuits selects one selection target signal/voltage from selection target signal/voltage group in accordance with the first bit group. Then, one signal/voltage is selected according to the second bit group from the signals/voltages selected by the first sub-decode circuits, and is transmitted to an output signal line. Each of second sub-decode circuits is formed of a single train of series switches, and only one of the switch train is made conductive to transmit a finally selected signal/voltage to the output signal line.

10 Claims, 8 Drawing Sheets

|  | GRADATION | LSB ⟵⟶ MSB | | | | ← SWH/SWL |
|---|---|---|---|---|---|---|
|  |  | D0 | D1 | D2 | D3 |  |
|  |  | SW0 | SW1 | SW2 | SW3 |  |
| V15 ⟷ | 15 | H (OFF) | H (OFF) | ↓ | ↓ |  |
| V14 ⟷ | 14 | L (ON) | H (OFF) | ↓ | ↓ |  |
| V13 ⟷ | 13 | H (OFF) | L (ON) | ↓ | ↓ |  |
| V12 ⟷ | 12 | L (ON) | L (ON) | H (OFF) | H (ON) |  |
| V11 ⟷ | 11 | H (OFF) | H (OFF) | ↓ | ↓ |  |
| V10 ⟷ | 10 | L (ON) | H (OFF) | ↓ | ↓ |  |
| V9 ⟷ | 9 | H (OFF) | L (ON) | ↓ | ↓ |  |
| V8 ⟷ | 8 | L (ON) | L (ON) | L (ON) | H (ON) |  |
| V7 ⟷ | 7 | H (OFF) | H (OFF) | ↓ | ↓ |  |
| V6 ⟷ | 6 | L (ON) | H (OFF) | ↓ | ↓ |  |
| V5 ⟷ | 5 | H (OFF) | L (ON) | ↓ | ↓ |  |
| V4 ⟷ | 4 | L (ON) | L (ON) | H (OFF) | L (OFF) |  |
| V3 ⟷ | 3 | H (OFF) | H (OFF) | ↓ | ↓ |  |
| V2 ⟷ | 2 | L (ON) | H (OFF) | ↓ | ↓ |  |
| V1 ⟷ | 1 | H (OFF) | L (ON) | ↓ | ↓ |  |
| V0 ⟷ | 0 | L (ON) | L (ON) | L (ON) | L (OFF) |  |
|  |  | 0 | 0 | 0 | 1 |  |

|  | GRADATION | D3 (MSB) | D2 | D1 | D0 (LSB) |
|---|---|---|---|---|---|
|  |  | SW0 | SW1 | SW2 | SW3 |
| V15 ⟷ | 15 | H (ON) | H (OFF) | ↓ | ↓ |
| V11 ⟷ | 11 | H (ON) | L (ON) | ↓ | ↓ |
| V7 ⟷ | 7 | L (OFF) | H (OFF) | ↓ | ↓ |
| V3 ⟷ | 3 | L (OFF) | L (ON) | H (OFF) | H (OFF) |
| V14 ⟷ | 14 | H (ON) | H (OFF) | ↓ | ↓ |
| V10 ⟷ | 10 | H (ON) | L (ON) | ↓ | ↓ |
| V6 ⟷ | 6 | L (OFF) | H (OFF) | ↓ | ↓ |
| V2 ⟷ | 2 | L (OFF) | L (ON) | H (OFF) | L (ON) |
| V13 ⟷ | 13 | H (ON) | H (OFF) | ↓ | ↓ |
| V9 ⟷ | 9 | H (ON) | L (ON) | ↓ | ↓ |
| V5 ⟷ | 5 | L (OFF) | H (OFF) | ↓ | ↓ |
| V1 ⟷ | 1 | L (OFF) | L (ON) | L (ON) | H (OFF) |
| V12 ⟷ | 12 | H (ON) | H (OFF) | ↓ | ↓ |
| V8 ⟷ | 8 | H (ON) | L (ON) | ↓ | ↓ |
| V4 ⟷ | 4 | L (OFF) | H (OFF) | ↓ | ↓ |
| V0 ⟷ | 0 | L (OFF) | L (ON) | L (ON) | L (ON) |
|  |  | 1 | 0 | 0 | 0 |

DECODE CIRCUITRY AND A DISPLAY DEVICE USING THE SAME

BACKGROUND OF THE INVENTION

1. Field of the Invention

The present invention relates to a decode circuit for decoding a multi-bit digital signal to produce an electric signal (voltage) corresponding to the multi-bit digital signal, and particularly to a decode circuit used in digital-to-analog conversion of converting the multi-bit digital signal to an analog signal, as well as to a display device supporting the decode circuit. More specifically, the invention relates to a configuration of a decode circuit in a digital-to-analog converter producing a pixel write voltage corresponding to input pixel data in an image display unit.

2. Description of the Background Art

For selecting one output candidate from a plurality of output candidates, a decode circuit is generally utilized. By utilizing a digital signal of n bits, one candidate can be selected from possible outputs of the n-th power of 2 in number, and a circuit layout area can be reduced, as compared with a configuration in which select signals are applied corresponding to the respective output candidates.

The construction of the decode circuit differs depending on the application of the decode circuit. For example, where one out of a plurality of signal lines is to be driven to a selected state as is performed, e.g., in an address decode circuit of a memory circuit, the decode circuit, such as a NAND type decode circuit, utilizing a logic gate is employed. According to the combination of bit values of n-bit digital signals, one of the plurality of signal lines is driven to the selected state depending on output signals of the logic gates.

When one electric signal is to be selected for output from a plurality of electric signals (currents or voltages), a ROM-type decode circuit using a switching matrix is employed. Switching elements in the switching matrix are selectively turned on to determine a route of the one electric signal in accordance with an input multi-bit signal. The connection between the switching elements and the input multi-bit signal is uniquely and fixedly established, and the relationship between the one/off states of the switching elements and the corresponding input signal bits is uniquely determined.

ROM-type decode circuit, as described above, is often utilized as a lookup table or the like, and is also used in a specific application as a digital-to-analog converter circuit for converting an input multi-bit signal (i.e., a digital signal formed of multiple bits) to an analog signal (voltage). Reference voltages corresponding to the respective levels which the input multi-bit signal can represent are prepared. Through a decoding operation, the reference voltage corresponding to the value of an applied multi-bit signal is selected. The values represented by the input multi-bit signal are discrete values, and the reference voltage levels are also discrete. Such digital-to-analog converter circuit is used, e.g., in a drive circuit for generating write voltages of pixels in a liquid crystal display unit. A reference voltage is selected corresponding to input pixel data, and the selected reference voltage is written onto a pixel electrode of the display pixel such as a liquid crystal element. Where the display element is the liquid crystal element, the brightness of the pixel is set according to the voltage between pixel electrodes, so that the liquid crystal element can represent an intermediate value between white and block, and gradation display can be implemented. Such liquid crystal elements are provided corresponding to red (R), green (G) and blue (B) so that the gradation display of color images can be achieved.

When the pixel data is n-bit data, the gradation display can be achieved at levels of n-th power of 2. Correspondingly, reference voltage levels of n-th power of 2 are required. For example, in the case of n=6, 6-th power of 2 is 64, and each of red (R), green (G) and blue (B) can be displayed at 64 levels, and multicolor display corresponding to 260 thousand colors can be implemented. In the case of (n=8), each of red (R), green (G) and blue (B) can be displayed at 256 (=eighth power of 2) levels, and multicolor display corresponding to 19.77 million colors can be implemented.

A digital-to-analog converter circuit for one color will now be discussed. In the case where the digital-to-analog converter circuit is implemented in a ROM-type decode circuit, and a switch matrix is used, for each reference voltage, switching transistors and receiving the respective input signal bits are connected in series. In this arrangement, the switching elements of n×(2^n) in number are required, where "^" represents a power, and the layout area of the decode circuit increases. Therefore, where a drive circuit is formed to be integrated with a display panel on the same chip, the chip real estate is greatly increased, which significantly impairs reduction in size of the display device.

Constructions aimed at reduction of layout areas of the digital-to-analog converter circuits are disclosed in Japanese Patent Laying-Open Nos. 2000-242209, 2000-066642 and 2003-029687 (References 1, 2 and 3, respectively).

According to the construction disclosed in Reference 1, gradation select units are provided corresponding to respective reference voltages. Each gradation select unit is comprised of a series connection body formed of a plurality of switching elements which are selectively turned on in accordance with a combination of bits of input pixel data, and these gradation select units are connected to a common output line (column line). The switching element is formed of a P- or N-channel MOS transistor (insulated gate field effect transistor). The MOS transistor is formed of a TFT (thin film transistor), and a well region for isolation of the P- and N-channel MOS transistors is not required to reduce a layout area of the circuit. Since the gradation select unit is simply formed of the series connection body of the switching elements, the elements are reduced in number as compared with a gradation select unit formed of a select switch, a latch circuit and a decode circuit, and the circuit layout area is reduced.

In the construction disclosed in the Reference 2, bits of input pixel data are divided into upper data bits and lower data bits. Reference voltage lines are provided corresponding in number to the gradation levels that can be represented by the upper bit group. Reference voltage select timing is set according to the value represented by the lower bit group, and the voltage level of each reference voltage line is adjusted such that the levels of the reference voltages rise by one quantum step. The upper bit group decode circuit is rendered active according to a select timing signal based on a decode result of the lower bit group, and the reference voltage determined by the select timing signal is selected and transmitted to an output line (a column line connected to the pixel element). A starting reference voltage is selected by the upper bit group, the reference voltage level is shifted according to the timing corresponding to the value of the lower bit group, the upper bit group decode circuit is activated according to such timing, and the upper bit decode circuit selects the corresponding reference voltage thus shifted. It is intended to reduce the number of the switching elements forming the gradation select unit. In the gradation select unit of the upper bit group decode circuit, the switching element is formed of a P- or N-channel MOS transistor.

In the construction disclosed in the Reference 3, input pixel data is divided into upper and lower bit groups, and the upper bit group selects the reference voltage line. The lower bit group is used for adjusting an active period of time of a select signal of an upper bit decode circuit. The voltage level of each reference voltage line starting from a start reference voltage is updated every predetermined time by one quantum step. The voltage level written onto the pixel data line (column line) is finally driven to the voltage level corresponding to the input pixel data. In the gradation select unit, the P- or N-channel MOS transistors are merely connected in series. Outputs of the respective gradation select units are commonly connected to an output line. Therefore, the construction in this Reference 3 includes a series connection body of the switch transistors responsive to the upper bits of the pixel data bits and the switching transistors responsive to the select signal provided by the lower data bit group, whereby a latch circuit and others are not required, and it is intended to reduce the number of the elements to reduce the layout area of the digital-to-analog converter circuit.

In the constructions disclosed in the References 1 to 3, MOS transistors of a single conduction type (P-channel MOS transistors or N-channel MOS transistors) are employed for the analog switches transmitting the reference voltages. For suppressing the influence of the threshold voltage of MOS transistors to accurately transmitting the reference voltages, therefore, it is necessary to provide a larger signal amplitude than in the case of utilizing an analog switch of a CMOS construction. This causes a problem of increase in current consumption of a circuit producing a control signal (select signal) corresponding to input pixel data. For obtaining a sufficient driving power of the MOS transistors, it is necessary to increase a channel width of the switching element, and this reduces the advantageous effect of reducing a layout area by the reduction in element number.

In the construction disclosed in the Reference 1, the transistors in the output stage of each gradation select unit are commonly connected to the output line. The gradation select units are arranged for the respective reference voltage lines, and the final stages (transistors nearest to the output line) are turned on according to the pixel data bit. Accordingly, a half of the final stage MOS transistors in the gradation select units are turned on, and on-capacitances of a large number of MOS transistors are connected to the output signal line so that its parasitic capacitance increases.

In the construction disclosed in the Reference 2, the reference voltage lines are prepared according to the number of gradation levels that can be represented by the upper bits, and one reference voltage line is selected according to the timing depending on the decoding result of the lower bits and the reference voltage level is successively raised. Therefore, when the change timing of the reference voltage deviates from the timing of the select timing signal resulting from the lower bit decoding, such a problem occurs that the reference voltage at a fully accurate level cannot be transmitted. Each reference current must be changed one quantum step at a time over the gradation levels which correspond in number to the lower bits, and this complicates the construction of the reference voltage generating unit. The gradation select unit includes a latch circuit for latching the decode result as well as the select switch for selecting the reference voltage line according to the output signal of the latch circuit to connects the selected line to the output line. This results in a problem that the elements in the gradation select unit are large in number, and the circuit layout area is large.

In the construction disclosed in the Reference 3, the gradation select unit likewise uses the P- or N-channel MOS transistors for the switching elements, and therefore, it is required to increase the amplitude of the signals for controlling on/off of the switching elements, so that the power consumption is large, similarly to Reference 1. Further, the select signal produced through decoding of the lower bits is commonly supplied to the transistors connected to the output line. Therefore, such a state is present that the switching elements of the gradation select units are commonly turned on. Thus, such a period of time is present that the parasitic capacitance of the output line is increased to cause a problem that the gradation level on the output line cannot be updated fast according to the input pixel data. Since the MOS transistors are used for the switching elements, the large layout area is required for increasing the driving power of the switching elements.

In the display devices employing the decode circuits disclosed in these References 1 to 3, the pixels are greatly increased in number for achieving higher definition, and the layout areas of the digital-to-analog converter circuits and particularly the pitches are made small. Therefore, even if a large number of MOS transistors are implemented, e.g., by TFTs (Thin Film Transistors), the switching transistors of the pixels are large in number. In order to lay out the digital-to-analog converter circuit along the direction of a smaller pitch, the size of a longitudinal direction must be increased, for example, through a layout of arranging the switching transistors, which are usually arranged on one line, on two lines. This extremely restricts the degree of freedom in layout, to cause a problem that the efficient circuit design is difficult to achieve.

In the case where the P- or N-channel MOS transistor is used as the switching element for the gradation selection and the amplitude of the control signal is increased, dielectric-breakdown voltage characteristics deteriorate, and the element durability is adversely affected. As a countermeasure, an analog switch of a CMOS type may be simply used for the switching element, a greater load capacitance (on-capacitance) comes to be parasitic on the output line, and it becomes impossible to perform a fast decode operation. Further, the total number of switching elements is great, and it becomes difficult to perform an efficient layout within a small area, and yield lowers in product manufacturing.

The construction of the decode circuit described above can be applied to the circuits other than the digital-to-analog converter circuit for producing the analog voltage according to the input digital data, and it can be applied, e.g., to a switch matrix circuit establishing a transmission path of a certain signal by a decode circuit, and in such a case, similar problems would occur.

SUMMARY OF THE INVENTION

An object of the invention is to provide a reliable decode circuit that occupies a small layout area, and can perform a fast decode operation to produce an output signal according to an input signal.

Another object of the invention is provide a reliable decode circuit for digital-to-analog conversion that can implement a fast decoding of input data to produce an analog signal with a reduced number of elements, as well as an image display device including such decode circuit.

The decode circuitry according to the invention includes a first bit group decode circuit arranged corresponding to a first bit group of a multi-bit digital signal of a multiplicity of bits, and decoding the first bit group; and a second bit group decode circuit arranged corresponding to a second bit group of plural bits of the multi-bit digital signal, and decoding the second bit group to select an output of the first bit group decode circuit and output a signal indicative of a decoding result. The multi-bit digital data is divided into a plurality of bit groups at least one of which includes plural bits, and the bit groups include the first bit group.

The first bit group decode circuit includes a plurality of first sub-decode circuits arranged corresponding to respective sets each including a plurality of output candidates. The first sub-decode circuits commonly receive the bit or bits of the first bit group, and each first sub-decode circuit selects one output candidate from a corresponding set of the output candidates.

The second bit group decode circuit includes a plurality of second sub-decode circuits arranged corresponding to the first sub-decode circuits, respectively, and commonly receiving the second bit group to select output electric signals of corresponding first sub-decode circuits and provide the selected output electric signals to the output line, respectively. Each of the second sub-decode circuits includes a series connection body of switching element or elements provided for the bit or bits of the second bit group and made selectively turned on in response to the respective bit or bits in the second bit group. The series connection bodies are commonly coupled to the output line, and the electric signal indicating the decode result is supplied to the output line.

The display device according to the invention uses the decode circuit according to the invention as a digital-to-analog converter circuit for converting digital pixel data into an analog voltage. The display device according to the invention further includes a plurality of data lines each coupled to a plurality of display pixels, and a data line drive circuit for driving the data lines according to an output voltage of the digital-to-analog converter circuit.

A second sub-decode circuit formed of one serial signal transmission path is arranged for each of the plurality of first sub-decode circuits. Therefore, the switching elements connected to the output line can be reduced in number, and the parasitic capacitance of the output line can be reduced so that a decode result signal can be produced fast. Since only one serial signal transmission path is arranged for each of the plurality of first sub-decode circuits, components of the decode circuit of the invention can be reduced in number, and accordingly, the layout area can be reduced.

Since the switching elements are reduced in number, a drive load on a buffer circuit producing control signals for driving the switching elements is reduced, and the driving power of the buffer circuit can be reduced. Accordingly, the power consumption and the layout area of the buffer circuit can be reduced.

Since the parasitic capacitance of the output signal line is reduced, it is possible to reduce the driving power of the buffer circuit driving the electric signal transmitted to the output signal line, and the power consumption of this buffer circuit can be reduced. Since it is possible to reduce the driving power of the transistors which are components of the buffer circuit, it is possible to reduce the sizes (channel widths) of the transistors, and accordingly, the low power consumption and the small layout area can be achieved.

Further, in the display device, the occupation area of the digital-to-analog converter circuit is reduced, and thereby the area of an entire of the display device is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
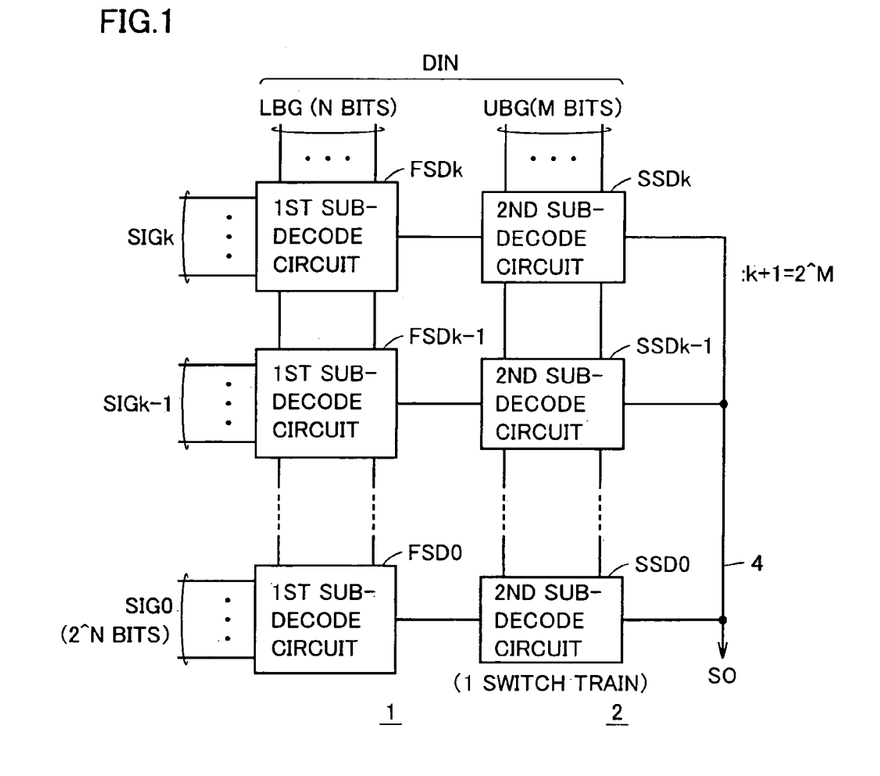
FIG. 1 schematically shows a construction of a decode circuit according to a first embodiment of the invention.

FIG. 1 schematically shows a construction of a decode circuit according to a first embodiment of the invention. In FIG. 1, the decode circuit includes a first decode circuit 1 for selecting one candidate from each of selection candidate groups SIG0–SIGk according to a lower bit group LBG of multi-bit data DIN, and a second decode circuit 2 for producing an output signal SO by selecting one output from the outputs of first decode circuit 1 according to an upper bit group UBG of multi-bit data DIN.

In multi-bit data DIN, lower bit group LBG includes N bits, and upper bit group UBG includes M bits. Each of selection candidate groups SIG0–SIGk includes an electric signal of $2^N$ bits. The electric signal is any of a logic signal, a voltage and a current. These selection candidate groups SIG0–SIGk are divided into groups according to a bit number M of upper bit group UBG, and satisfy a relationship of k+1=2^M.

The first decode circuit 1 includes first sub-decode circuits FSD0–FSDk, arranged corresponding to selection candidate groups SIG0–SIGk, respectively, and commonly receiving the N bits of lower bit group LBG, each for selecting one candidate electrical signal from the corresponding selection candidate group.

Second decode circuit 2 includes second sub-decode circuits SSD0–SSDk which are arranged corresponding to first sub-decode circuits FSD0–FSDk, respectively, commonly receive M bits of upper bit group UBG and select the output electric signals of corresponding first sub-decode circuits FSD0–FSDk, respectively. Second sub-decode circuits SSD0–SSDk are each formed of one series connection body of switching elements, and have the outputs commonly coupled to an output signal line 4.

Each of first sub-decode circuits FSD0–FSDk selects one electric signal. One of second sub-decode circuits SSD0–SSDk is made conductive to transmit the output electric signal of the corresponding first sub-decode circuit to output signal line 4.

The selection candidates are (2^N)×(k+1) in total number. Second sub-decode circuits SSD0–SSDk connected to output signal line 4 are k+1 in number. As compared with the number (2^N)×(k+1) of second sub-decode circuits SSD0–SSDk that are arranged corresponding to the selection candidates, respectively, it is possible to reduce significantly the number of the second sub-decode circuits, and the parasitic capacitance of output signal line 4 can be reduced.

Figure 2:
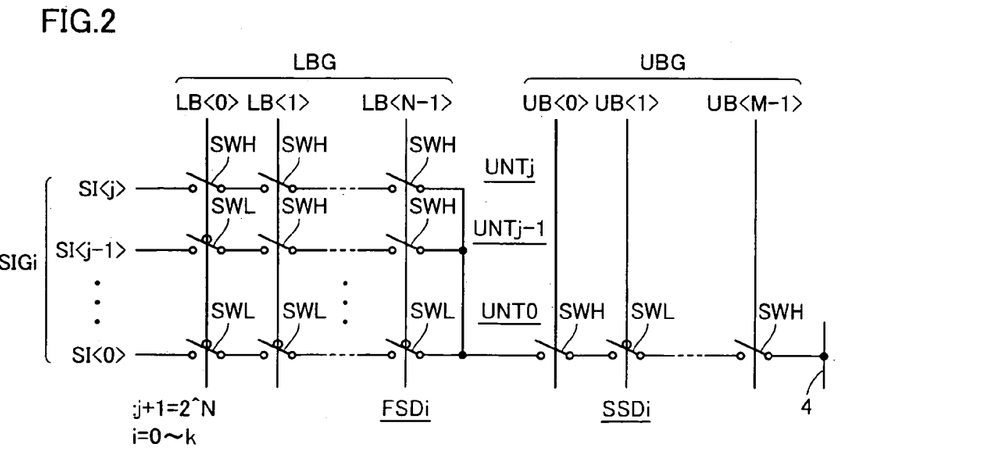
FIG. 2 specifically shows constructions of one first sub-decode circuit and one second sub-decode circuit in the decode circuit shown in FIG. 1.

FIG. 2 specifically shows constructions of first sub-decode circuit FSDi and corresponding second sub-decode circuit SSDi in the decode circuit shown in FIG. 1.

In FIG. 2, selection candidate group SIGi corresponding to first sub-decode circuit FSDi includes input electric signals SI<0>, . . . SI<j>, where j satisfies a relationship of j+1=2^N.

First sub-decode circuit FSDi includes select units UNT0–UNTj arranged corresponding to input electrical signals SI<0>–SI<j>, respectively. Each of select units UNT0–UNTj includes a series connection body of switching elements, and the respective switching elements of each series connection body are supplied with bits LB<0>–LB<N-1> of lower bit group LBG. Each of select units UNT0–UNTj is includes switching elements selected from switching elements (positive polarity switches) made conductive when corresponding bits are at the H level (logical higH level) and switching elements (negative polarity switches) made conductive when corresponding bits are at the L level (logical low level). For example, as shown in FIG. 2, select unit UNT0 includes the series connection body formed of negative polarity switches SWL which are turned on when the corresponding bits are at the L level, and select unit UNT(j-1) includes the series connection body formed of negative polarity switch SWL which is turned on when bit LB<0> is at the L level and positive polarity switches SWH which are turned on when bits LB<1>, . . . , LB<N-1> are at the H level. Select unit UNTj includes the series connection body formed of positive polarity switches SWH which are turned on when corresponding bits LB<0>–LB<N-1> are at the H level.

These select units UNT0–UNTj are commonly coupled to subsequent sub-decode circuit SSDi via a longitudinal interconnection line.

The arrangement manner of positive and negative polarity switches SWH and SWL in each of these select units UNT0–UNTi is uniquely determined such that only one of the select units is made conductive according to bits LB<0>–LB<N-1> of lower bit group LBG. These select units UNT0–UNTi execute a first decode operation of selecting one electric signal from corresponding selection candidate group SIGi according to lower bit group LBG.

Second sub-decode circuit SSDi includes a series connection body formed of switching elements receiving corresponding bits UB<0>–UB<M-1> of upper bit group UBG on their gates, respectively. In the example shown in FIG. 2, second sub-decode circuit SSDi includes, as switching elements of the series connection body, a positive polarity switch SWH which is turned on when bit UB<0> is at the H level, a negative polarity switch SWL which is turned on when bit UB<1> is at the L level and positive polarity switch SWH which is turned on when bit UB<M-1> is at the H level.

In second sub-decode circuit SSDi, the arrangement manner of positive and negative polarity switches SWH and SWL depends on the arrangement position of second sub-decode circuit SSDi. These switches SWH and SWL are arranged such that only one of second sub-decode circuits SSD0–SSDk shown in FIG. 1 is made conductive according to bits UB<0>–UB<M-1> of upper bit group UBG. Second sub-decode circuit SSDi executes a second decode operation of selecting the output of first sub-decode circuit FSDi.

M and N may be equal to or different from each other. The values of M and N are determined according to the construction of the decode circuit to be implemented or the number of the selection candidates. The data bits may not be divided into the two groups of the upper and lower bit groups, and the decode circuit may be formed into three or more stages of sub-decode circuits. It is sufficient that each of the sub-decode circuits in the final stage is formed of one switch series connection body, and only one of the plurality of final sub-decode circuits is made conductive.

Figure 3A:
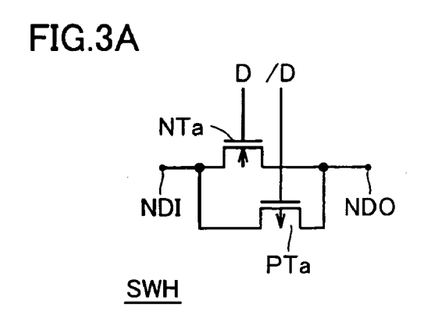
FIG. 3A shows an electrically equivalent circuit of a positive polarity switch shown in FIG. 2.
Figure 3B:
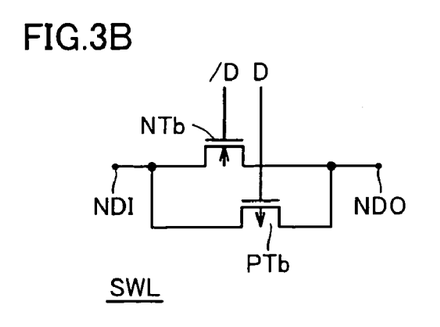
FIG. 3B shows an electrically equivalent circuit of a positive polarity switch shown in FIG. 2.

FIGS. 3A and 3B show examples of constructions of positive and negative polarity switches SWH and SWL shown in FIG. 2, respectively. Positive and negative polarity switches SWH and SWL are formed of CMOS (Complementary MOS) analog switches (transmission gates) as shown in FIGS. 3A and 3B, respectively. More specifically, as shown in FIG. 3A, positive polarity switch SWH includes an N-channel MOS transistor NTa connected between nodes NDI and NDO and receiving a bit D on its gate, and a P-channel MOS transistor PTa connected between nodes NDI and NDO and receiving a complementary bit /D on its gate. Bits D and /D are complementary to each other, and bit D is "1" (at the H level) when bit /D is "0" (at the L level). Therefore, when bit D is "1", both MOS transistors NTa and PTa in positive polarity switch SWH are on, and electrically couple nodes NDI and NDO with each other. When bit D is "0", both MOS transistors NTa and PTa are off, and electrically isolate nodes NDI and NDO from each other.

Negative polarity switch SWL includes an N-channel MOS transistor NTb connected between nodes NDI and NDO and receiving complementary bit /D on its gate, and a P-channel MOS transistor PTb connected between nodes NDI and NDO and receiving bit D on its gate. When bit D is at the L level ("0"), both MOS transistors NTb and PTb are on, and electrically couple nodes NDI and NDO with each other. When bit D is at the H level ("1"), both MOS transistors NTb and PTb are off, and electrically isolate nodes NDI and NDO from each other.

Although the CMOS analog switches are utilized as shown in FIGS. 3A and 3B, the turned-on MOS transistors connected to output signal line 4 are k+1 in number, and therefore the number of the switching elements in the on-state can be significantly reduced as compared with the number of (2^N)×(k+1) in the case of providing the serial signal transmission path for each selection candidate, so that the parasitic capacitance of the output signal line can be reduced.

The number of the switching elements can be reduced to provide an increased margin in the layout, and the MOS transistors forming switching elements SWH and SWL can be increased in size to reduce the resistances of the signal transmission paths.

The CMOS analog switches are utilized, and the complementary signals are utilized for on/off control signals. Therefore, it is not necessary to consider the threshold voltage losses across the MOS transistors upon propagation of the electric signal, and it is not necessary to increase the signal amplitude of the on/off control signal. For example, when the selection candidate is a voltage, it is possible to utilize a signal that varies between the maximum and minimum voltages of the selection candidate, and the current consumption of the circuit producing the on/off control signal (data bits) can be reduced. Also, the time required for settling of the on/off signal (data bits) can be reduced, and the decode operation can be started at a faster timing.

Figure 4:
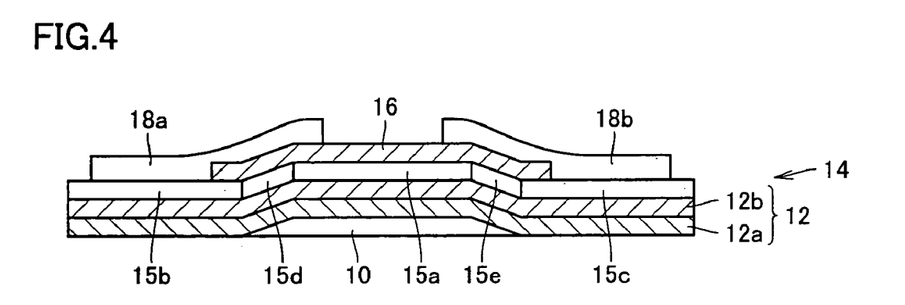
FIG. 4 schematically shows by way of example a cross sectional structure of an MOS transistor shown in FIG. 3.

FIG. 4 schematically shows an example of a sectional structure of an MOS transistor forming the switching element. Referring to FIG. 4, the MOS transistor (PTa, PTb, NTa and NTb) is formed of, e.g., bottom-gate-type low-temperature polycrystalline silicon TFT (thin film transistors). The thin film transistor includes a gate electrode 10 formed on an insulating substrate, a gate insulating film 12 formed over gate electrode 10 and a polycrystalline silicon layer 14 formed on gate insulating film 12.

Gate insulating film 12 has a multilayer film structure including a first gate insulating film 12a formed of, e.g., a silicon nitride film (SiN) and a second insulating film 12b formed of, e.g., a silicon dioxide ($SiO_2$) film.

Polycrystalline silicon layer 14 includes heavily doped impurity regions 15b and 15c of a first conductivity type separated from each other, lightly doped impurity regions 15d and 15e of the first conductivity type adjacent to heavily doped impurity regions 15b and 15c, respectively, and a body region 15a of a second conductivity type formed between lightly doped impurity regions 15d and 15e. A channel is formed at body region 15a in accordance with a voltage applied to gate electrode 10 so that the transistor is turned on.

Gate electrode 10 overlaps with lightly doped impurity regions 15d and 15e as well as body region 15a. An interlayer insulating film 16 entirely covers body region 15a and lightly doped impurity regions 15d and 15e, and partially covers heavily doped impurity regions 15b and 15c. Interlayer insulating film 16 is formed of, e.g., a silicon dioxide film. Heavily doped impurity regions 15b and 15c are connected to electrodes 18a and 18b formed of a low-resistance conductive layer, respectively. Lightly doped impurity regions 15d and 15e form a so-called LDD structure (Lightly Doped Diffusion structure), and mitigates electric fields at source/drain ends.

In this TFT (Thin Film Transistor), a foundation layer is formed of an insulating material such as a glass substrate or an epoxy substrate, and polycrystalline silicon layer 14 is formed in the intermediate layer, being isolated from the substrate, and parasitic capacitances such as a substrate capacitance (junction capacitance) can be reduced as compared with a bulk-type MOS transistor formed at a semiconductor substrate region. The height of the TFT can be reduced by reducing the thickness of polycrystalline silicon layer 14. By utilizing the low-temperature polycrystalline silicon TFTs, the decode circuit can be manufactured in the same manufacturing step, for example, as the pixel select transistor in the pixel of the image display device.

In the thin film transistor, however, electrode layers 18a and 18b overlap with body region 15a and lightly doped impurity regions 15d and 15e. Therefore, a capacitance of a parallel plate type is formed as a parasitic capacitance when a channel is formed at body region 15a, so that the parasitic capacitance is larger than that of the bulk-type MOS transistor in which a junction capacitance is a main component of the on-capacitance.

In the decode circuit according to the invention, however, the switching elements connected to the output signal line are reduced in number, and the parasitic capacitance associated with the output signal line can be reduced even if the thin film transistors (TFTs) are employed as the components.

Even when a top-gate-type low-temperature polycrystalline silicon TFT having a gate electrode above body region 15a is used as the thin film transistor (TFT), a portion where the gate electrode overlaps with the source/drain electrode layer likewise has a large capacitance, so that the on-capacitance is large.

The structure of the thin film transistor (TFT) is not restricted to the structure shown in FIG. 4, and the TFT of another structure may employed.

Figure 5:
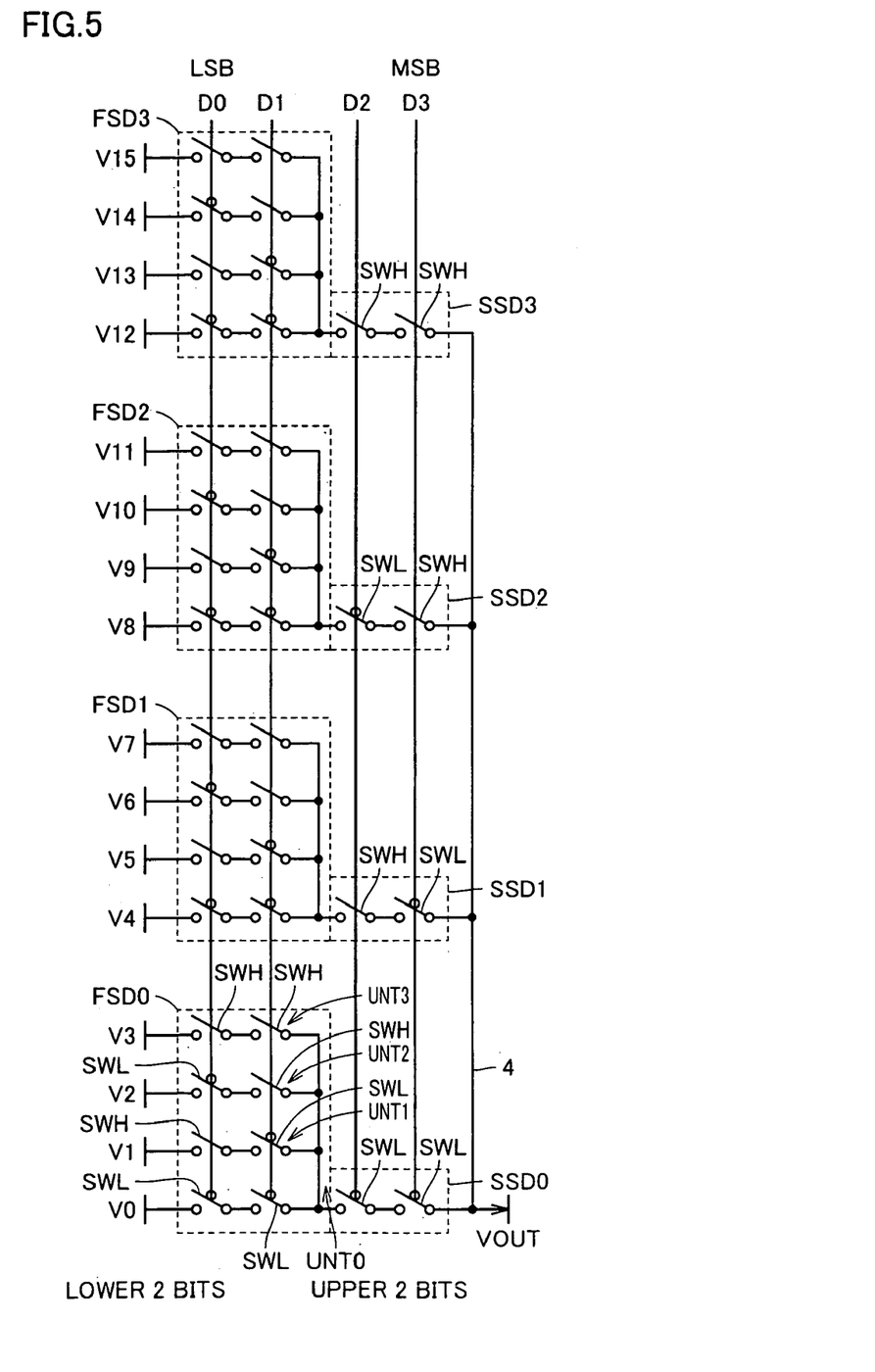
FIG. 5 shows a specific example of a decode circuit in the first embodiment of the invention.

FIG. 5 shows a specific construction of the decode circuit according to the first embodiment of the invention. FIG. 5 shows, by way of example, the decode circuit by which one of reference voltages V0–V15 is selected according to 4-bit data D3–D0. Bit D3 is the most significant bit (MSB), and bit D0 is the least significant bit (LSB). Reference voltages V0–V15 are used for gradation display by the image display device, and the display with a 16 gradation levels can be implemented. Values of bits D3–D0 correspond to the numbers assigned to reference voltages V15–V0. For example, when bits D3–D0 are (1, 0, 0, 0), reference voltage V8 is designated.

Reference voltages V0–V15 are divided into four groups (V0, V1, V2 and V3), (V4, V5, V6 and V7), (V8, V9, V10 and V11) and (V12, V13, V14 and V15). First sub-decode circuits FSD0–FSD3 are arranged corresponding to the sets of reference voltages, respectively. First sub-decode circuits FSD0–FSD3 are commonly supplied with lower two bits D0 and D1. Each of first sub-decode circuits FSD0–FSD3 includes select units corresponding to the four reference voltages, respectively. The arrangement manner of the select units in each of first sub-decode circuits FSD0–FSD3 is the same as the others. In FIG. 5, reference characters are assigned to the switching elements of the components of each select unit in first sub-decode circuit FSD0.

In first sub-decode circuit FSD0, select unit UNT0 arranged for reference voltage V0 includes a series connection body formed of negative polarity switch SWL receiving least significant bit D0 on its control node and negative polarity switch SWL receiving bit D1 on its control node.

Select unit UNT1 arranged for reference voltage V1 includes a series connection body formed of positive polarity switch SWH receiving bit D0 on its control node and negative polarity switch SWL receiving bit D1 on its control node.

Select unit UNT2 arranged for reference voltage V2 includes a series connection body formed of negative polarity switch SWL receiving bit D0 on its control node and positive polarity switch SWH receiving bit D1 on its control node.

Select unit UNT3 arranged for reference voltage V3 includes a series connection body formed of positive polarity switches SWH which are selectively turned on in response to bits D0 and D1, respectively.

Each of first sub-decode circuits FSD1–FSD3 likewise includes select units UNT0–UNT3 for the respective four reference voltages.

First sub-decode circuits FSD0–FSD3 are decode circuits performing four-to-one selection according to bits D0 and D1. According to bits D0 and D1, the select unit at the same position in each of first sub-decode circuits FSD0–FSD3 is made conductive, to select one reference voltage concurrently with others.

Select units UNT0–UNT3 are commonly coupled to corresponding second sub-decode circuit SSDi in the next stage via the longitudinal interconnection line extending longitudinally in the figure.

Second sub-decode circuits SSD0–SSD3 are arranged corresponding to first sub-decode circuits FSD0–FSD3, respectively. Select units UNT0–UNT3 in each of first sub-decode circuits FSD0–FSD3 are commonly connected to a corresponding one of second sub-decode circuits SSD0, SSD1, SSD2 and SSD3 via the corresponding longitudinal interconnection line.

Second sub-decode circuit SSD0 includes a series connection body formed of negative polarity switches SWL that receive bits D2 and D3 on their control nodes, respectively, and are turned on to select the output voltage of first sub-decode circuit FSD0 and transmit the selected output voltage to output signal line 4.

Second sub-decode circuit SSD1 includes a series connection body formed of positive polarity switch SWH that is selectively turned on according to bit D2 and negative polarity switch SWL that is selectively turned on according to bit D3. Second sub-decode circuit SSD2 includes a series connection body formed of negative polarity switch SWL that is selectively turned on according to bit D2 and positive polarity switch SWH that is selectively turned on according to bit D3. Second sub-decode circuit SSD3 includes a series connection body formed of positive polarity switches SWH that are selectively turned on according to bits D2 and D3, respectively.

Second sub-decode circuits SSD0–SSD3 have the same switch connection paths as select units UNT0–UNT3 in the first sub-decode circuits, respectively. According to upper bits D2 and D3, one of second sub-decode circuits SSD0–SSD3 is made conductive to transmit the reference voltage selected by the corresponding first sub-decode circuit to output signal line 4.

The construction of the decode circuit shown in FIG. 5 can significantly reduce the number of components (switching elements) of the second decode circuit as compared with the case where four switching elements are connected in series for each of reference voltages V0–V15 for performing the decode operation, and accordingly, the parasitic capacitance of output signal line 4 can be reduced.

Switches SWL and SWH have the same structures as the switching elements shown in FIGS. 3A and 3B. Although the CMOS analog switches are used, the number of elements is reduced, and the parasitic capacitance (on resistance) associated with output signal line 4 can be reduced.

Figure 6:
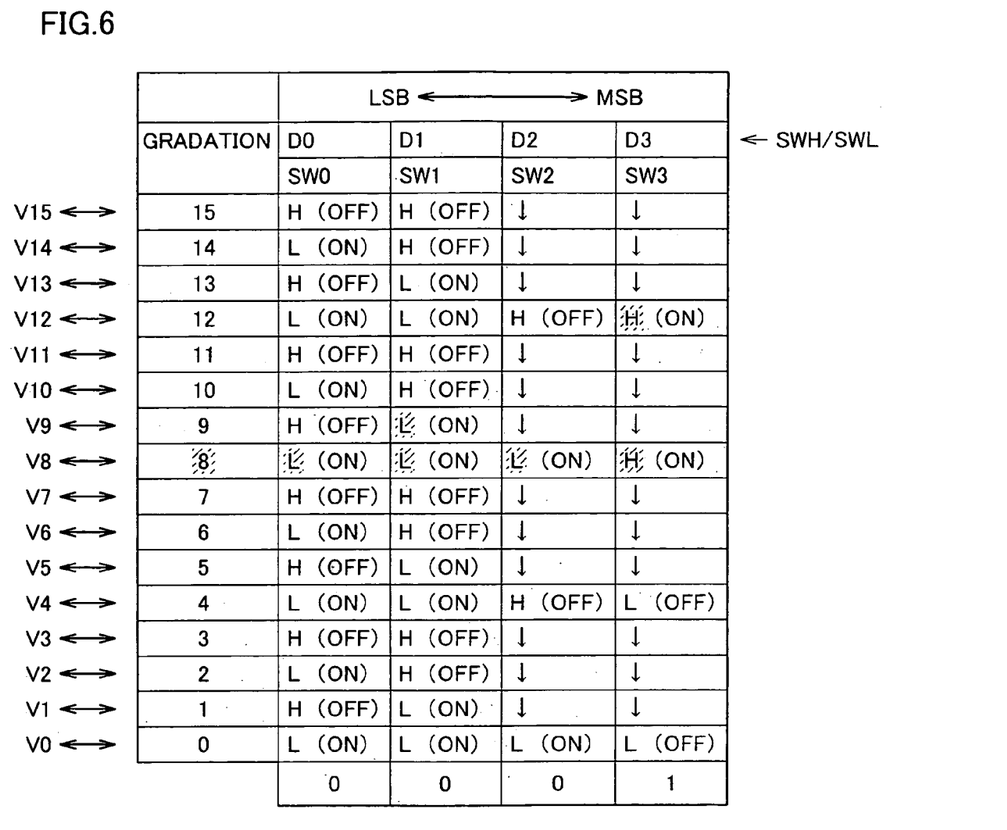
FIG. 6 shows, in a table form, logical levels of control nodes assumed when the switches in the decode circuit shown in FIG. 5 attain the on state as well as on/off states of respective switching elements upon selection of the gradation 8.

FIG. 6 shows, in a table form, logical levels of corresponding bits for turning on the respective switching elements in the decode circuit shown in FIG. 5 and the on/off states of the switching elements in selecting the reference voltage V8. In the shown example, the decode circuit is used to select the reference voltage for implementing the gradation display in the image display device. Gradations 0–15 in 16-level gradation display correspond to reference voltages V0–V15, respectively. Switching elements SW0–SW3 correspond to the switching elements connected in series in each select unit, respectively. Switching elements SW0–SW3 are positive or negative polarity switches SWH or SWL, and receive data bits D0–D3 on the control nodes, respectively. Bit D0 is the least significant bit LSB, and bit D3 is the most significant bit MSB.

In the table of FIG. 6, each downward arrow indicates the longitudinal interconnection line commonly connected to the outputs of a corresponding one of first sub-decode circuits FSD0, FSD1, FSD2 and FSD3 in the decode circuit shown in FIG. 5.

Characters "H" or "L" used for switches SW0–SW3 for each gradation represent the logical levels of the data bits at which the switching elements are made conductive.

For selecting the gradation 8, data bits D<3:0> are (1, 0, 0, 0). In the gradation 8, therefore, all switching elements SW0–SW3 are on. In this state, switching element SW3 is likewise turned on in the gradation 12. In the gradation 9, switching element SW1 is turned on, but switching element SW0 is off so that the transmission path of reference voltage V9 is cut off.

For the gradations 7 to 1, switching elements SW3 are off, and the on-states of the switching elements of the sub-decode circuits do not affect output signal line 4.

Switching elements SW2 for the gradations 8 and 0 are turned on. In this state, however, the associated switching element SW3 for the gradation 0 is in the off state, and the parasitic capacitance of switching element SW2 does not serve as an on-capacitance on output signal line 4.

Therefore, when the gradation 8 is to be selected, the parasitic capacitance associated with output signal line 4 is provided by only the on-capacitance of the switching element SW3 for the gradation 12, other than switching element SW3 of the gradation 8 and switching element SW1 of the gradation 9, and this unnecessary parasitic capacitance Cpar is expressed by the following relation, where Con represents the on-capacitance of switch SWH or SWL.

Cpar=Con

Therefore, the parasitic capacitance associated with the output signal line can be significantly reduced, and the RC time constant in the propagation path of the selected reference voltage can be significantly reduced. Accordingly, the reference voltage corresponding to the gradation selected through the decode operation can be transmitted fast to output signal line 4.

In this decode circuit, the switching elements of the second sub-decode circuits decoding the upper bit group are significantly reduced in number, and the load capacitances of the interconnection lines transmitting data bits D3 and D2 are reduced so that the power consumption can be reduced. In addition, these data bits D3 and D2 can be rapidly set to the settled state.

Even if each of switches SWH and SWL is formed of the CMOS analog switch in second decode circuit 2 (second sub-decode circuits SSD0–SSD3), the transmission lines of data bits D3 and D2 cross the internal signal propagation path of each of sub-decode circuits SSD0–SSD3 only at one crossing portion, so that the cross portions can be reduced in number, and it is possible to reduce the coupling capacitances between the signal lines transmitting data bits D3 and D2 and the paths transmitting the selected reference voltages. Therefore, crosstalk noises between signal/voltage propagation lines can be reduced, and the reference voltage can be accurately transmitted.

The input reference voltages are selected using the lower bit group, and the output electric signal of the first sub-decode circuit is selected according to the upper bit group. The bit values of the data bits in each of the first and second sub-decode circuits are made corresponding to the conduction/non-conduction states of the corresponding select units. When the voltage level of the reference voltage rises monotonously from reference voltage V0 to reference voltage V15, no crossing portion is present on the reference voltage transmitting lines, the coupling capacitance noises at the crossing portion of these reference voltage lines can be reduced, and the reference voltage can be stably transmitted. Thus, in the analog circuit to have the display gradation of pixels determined by the reference voltages, the accurate reference voltages can be transmitted to implement the accurate gradation display in the image display device, and the multi-level gradation display can be stably achieved.

The decode circuit is divided into the first and second decode circuits. If the divided portions (stages) between the input and the output of the decode circuit increase in number, the number of the crossings where the sub-output signal line (longitudinal lines) commonly coupling the outputs of the select units in each sub-decode circuit cross the signal lines crossing the sub-output signal lines on the planar layout is increased to increase the crosstalk noises. Also, the number of the signal lines commonly coupling the outputs of the sub-decode circuits is increased to increase the interconnection layout area. Therefore, the number of the divided portions between the input and the output of the decode circuit is determined taking into account the effect of improving the time constant, the area occupied by the interconnections and the crosstalk noises due to the interconnection crossing.

The number of the divided portions between the input and the output of the decode circuit is not restricted to two, and may be more than two. It is sufficient to form the path of transmitting the electric signal of each respective sub-decode circuit in the final decode stage with a single switch series connection body.

The number of the sub-decode circuits in each sub-decode stage as well as the number of the sub-decode stages are set to optimum values by totally considering the number of divided stages (the number of stages from the input to the output) of the decode circuit, the number of selection target signal lines in each sub-decode stage, the layout pitch of the switching elements and resistance/capacitance components of the switching elements.

According to the first embodiment of the invention, as described above, the selection targets (candidates) are divided into a plurality of groups, the first sub-decode circuits performing the decode operation according to the lower bit data are arranged corresponding to the selection candidate groups, respectively, and the sub-decode circuits each formed of one signal propagation path (switching element train) are arranged in the final sub-decode stage connected to the output signal line, and are commonly coupled to the output signal line. Thus, the parasitic capacitance associated with the output signal line can be reduced, and the decode circuit performing the fast and stable decode operation with a small layout area can be achieved.

Particularly, in the construction having the switching element formed of a low-temperature polycrystalline silicon TFT, the influence of the large on-capacitances of such TFTs can be advantageously reduced, and the embodiment of the present invention is effective.

Second Embodiment

Figure 7:
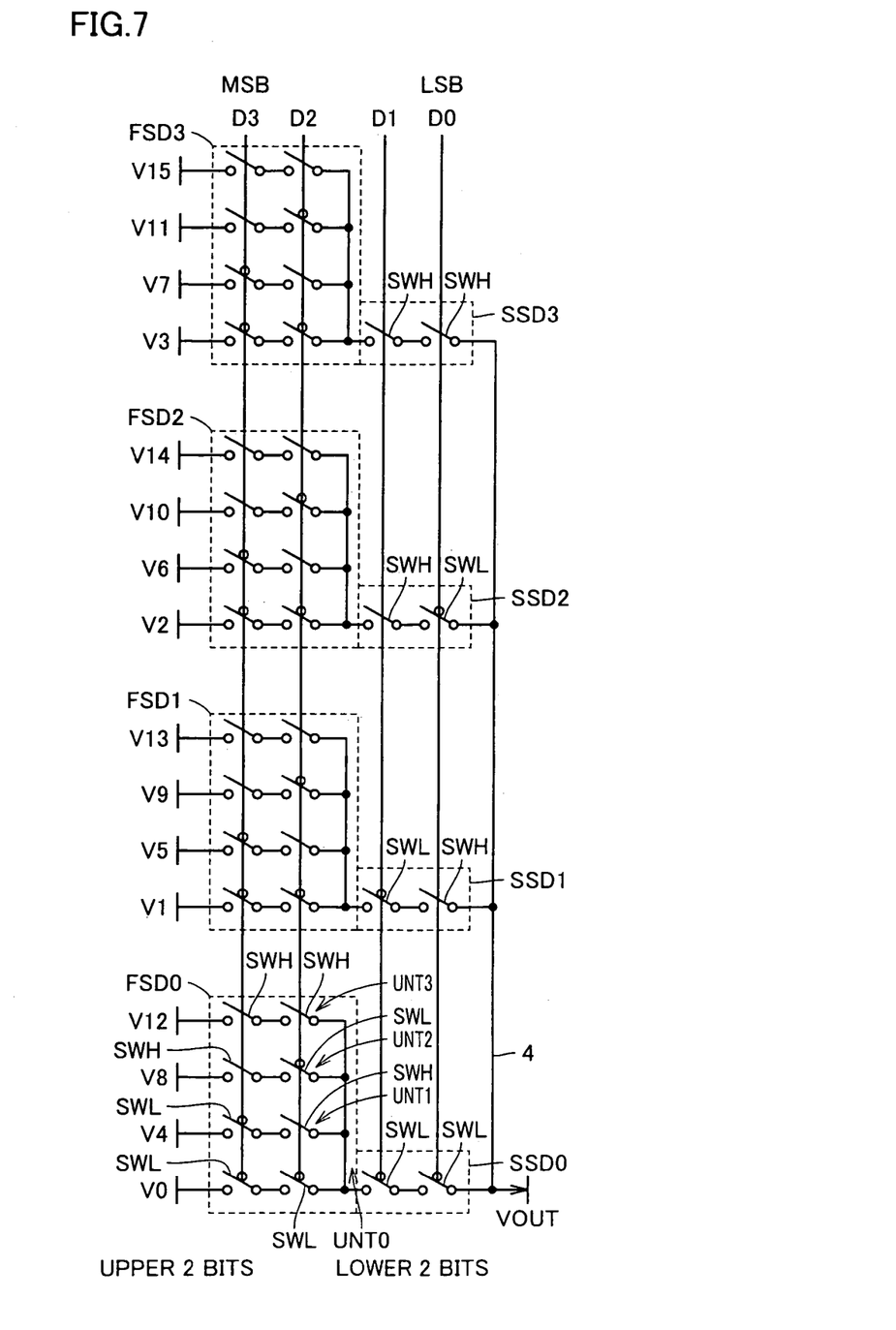
FIG. 7 shows a construction of a decode circuit according to a second embodiment of the invention.

FIG. 7 shows a construction of a decode circuit according to a second embodiment of the invention. The decode circuit shown in FIG. 7 employs four-bit data D3–D0, for selecting one from 16 reference voltages V0–V15. This decode circuit may be utilized for the decode circuit of the digital-to-analog conversion unit in the image display device implementing the 16-level gradation display. Most significant bit MSB is bit D3, and least significant bit LSB is bit D0. The decode operation is first performed according to upper bits D3 and D2, and subsequently the final decode operation is performed according to the lower bit group.

Since data bits D3–D0 represent the numbers indicating reference voltages V0–V15, the selection candidate reference voltages V0–V15 are divided into reference voltage sets of V(4n), V(4n+1), V(4n+2) and V(4n+3), where n is an integer from 0 to 3. First sub-decode circuit FSD0 is arranged for the set of reference voltages V(4n: n=0, 1, 2, 3), first sub-decode circuit FSD1 is arranged for the set of reference voltages V(4n+1: n=0, 1, 2, 3), first sub-decode circuit FSD2 is arranged for the set of reference voltages V(4n+2: n=0, 1, 2, 3), and first sub-decode circuit FSD3 is arranged for the set of reference voltages V(4n+3: n=0, 1, 2, 3).

For selecting the reference voltage according to upper bits D3 and D2, select units UNT0–UNT3 are arranged corresponding to the four reference voltages in each of first sub-decode circuits FSD0–FSD3, respectively, but the arrangement manner of the switching elements in each select unit is different from that of the switching elements in the decode circuit shown in FIG. 5. In FIG. 7, the arrangement manners of the switching elements in first sub-decode circuits FSD0–FSD3 are the same with each other, and therefore reference characters are assigned to only the switching elements in select units UNT0–UNT3 for first sub-decode circuit FSD0.

Select unit UNT0 includes a series connection body formed of negative polarity switches SWL receiving bits D3 and D2 on their control nodes. Select unit UNT1 includes a series connection body formed of negative polarity switch SWL receiving bit D3 on its control node and positive polarity switch SWH receiving bit D2 on its control node. Select unit UNT2 includes a series connection body formed of positive polarity switch SWH receiving bit D3 on its control node and negative polarity switch SWL receiving bit D2 on its control node. Select unit UNT3 includes a series connection body formed of positive polarity switches SWH receiving bits D3 and D2 on their control nodes.

Second sub-decode circuits SSD0–SSD3 commonly receiving lower bits D1 and D0 are arranged corresponding to first sub-decode circuits FSD0–FSD3, respectively. These second sub-decode circuits SSD0–SSD3 are each formed of series connections body of the switching elements. Second sub-decode circuit SSD0 includes a series connection of negative polarity switch SWL receiving bits D1 and D0 on their control nodes. Second sub-decode circuit SSD1 includes the series connection body of negative polarity switch SWL receiving bit D1 on its control node and positive polarity switch SWH receiving bit D0 on the control node. Second sub-decode circuit SSD2 includes a series connection body of positive polarity switch SWH receiving bit D1 on its control node and negative polarity switch SWL receiving bit D0 on its control node. Second sub-decode circuit SSD3 includes a series connection body of positive polarity switches SWH receiving bits D1 and D0 on their control nodes.

The constructions of positive and negative polarity switches SWH and SWL are substantially the same as those shown in FIGS. 3A and 3B, and both are each formed of the CMOS analog switch (transmission gate).

In the decode circuit shown in FIG. 7, each of first sub-decode circuits FSD0–FSD3 selects one reference voltage according to upper bits D3 and D2. Thus, each of first sub-decode circuits FSD0–FSD3 performs 4-to-1 selection, and 16-to-4 selection is performed as a whole in the first decoding stage.

Second sub-decode circuits SSD0–SSD3 select the output of one of the first sub-decode circuits according to lower bits D1 and D2. Second sub-decode circuits SSD0–SSD3 perform the 4-to-1 selection operation. The switching elements in the final stages of sub-decode circuits SSD0–SSD3 are commonly coupled to output signal line 4.

Figure 8:
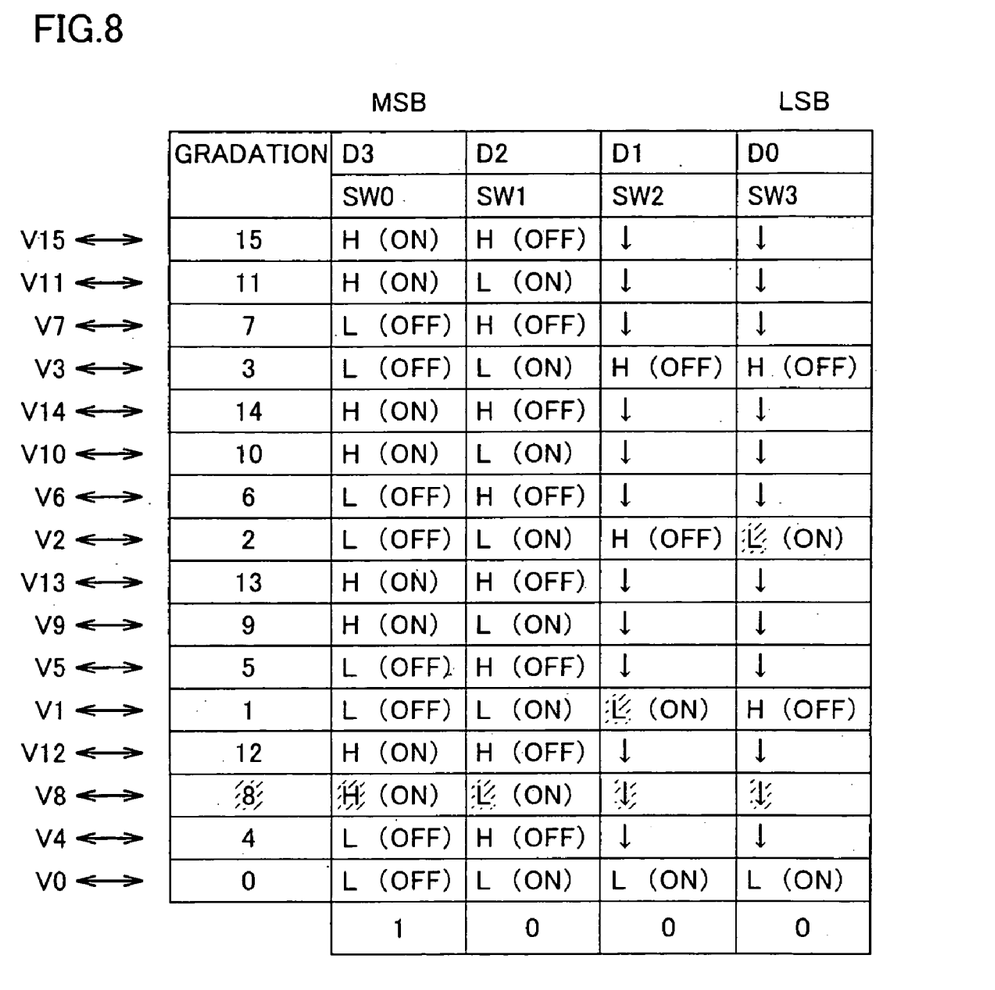
FIG. 8 shows, in a table form, logical levels of control nodes assumed when the respective switching elements in the decode circuit shown in FIG. 7 attain the on state as well as on/off states of the respective switching elements upon selection of the gradation 8.

FIG. 8 shows, in a table form, the logical levels of the signals assumed when switching elements SWL–SW3 are turned on in the decode circuit shown in FIG. 7. FIG. 8 also shows the on/off states of the switching elements upon selection of reference voltage V8 for the display of gradation 8.

When the gradation 8 is selected, bits D<3:0> are (1, 0, 0, 0). Reference voltage V8 corresponding to the gradation 8 is transmitted to the output signal line because the switching elements on the corresponding electric signal transmission path are all turned on. At least one of the switching elements for each of the other reference voltages is in the off state. As shown in FIG. 8, the switching element which is turned on in the second sub-decode circuits connected to the output signal line 4 is switching element SW3 for the gradation 2. Switching element SW2 for the gradation 2 is off when the gradation 8 is selected. Therefore, the parasitic capacitance (on-capacitance) in the on state of switching element SW3 for the gradation 2 is coupled to the output signal line. In the switching series for the gradation 1, switching element SW2 is turned on, but switching element SW3 for the gradation 1 is off in this state, so that this switching series is isolated from the output signal line 4, and the on-capacitance of switching element SW2 of gradation 1 does not affect the output signal line.

In the decode circuit shown in FIG. 7, each sub-decode circuit in the final sub-decode stage is formed of a single train of series switching elements, and these switching element trains are commonly connected to the output signal line. Only one of the plurality of switching trains in the final stage is made conductive, and the output signal line is additionally connected to the on-capacitance of the switching element in the final stage of only one of the other switching trains. In this case, therefore, on-capacitance Con of only two switching elements are additionally connected as the parasitic capacitance of the output signal line, similarly to the case of the first embodiment. Thus, the parasitic capacitance is sufficiently reduced, so that the decode operation can be performed fast to transmit the reference voltage corresponding to the decode result to output signal line 4.

With the decode circuit according to the second embodiment, the layout area, the power consumption and the crosstalk noises due to the signal line crossing can be reduced, similarly to the decode circuit of the first embodiment.

According to the second embodiment of the invention, as described above, the multi-bit data is divided into the upper and lower bit groups, the initial-stage operation of decoding the input selection target signal is performed according to the upper bit group, and the sub-decode circuits each formed of one switching train and arranged in the final output stage are configured such that one of the sub-decode circuits is made conductive according to the lower bit group. Therefore, the parasitic capacitance associated with the output signal line can be reduced, and the fast decode operation can be achieved with a small layout area.

In the second embodiment, the decode circuit may not be used in the digital-to-analog converter circuit for selecting the gradation voltages in the image display device, and may be used, e.g., as a lookup table for selecting general signals.

The number of divided portions from the input stage to the final stage of the decode circuit as well as the number of the sub-decode circuits in each sub-decode stage can be appropriately determined according to the application purposes and usages.

Third Embodiment

Figure 9:
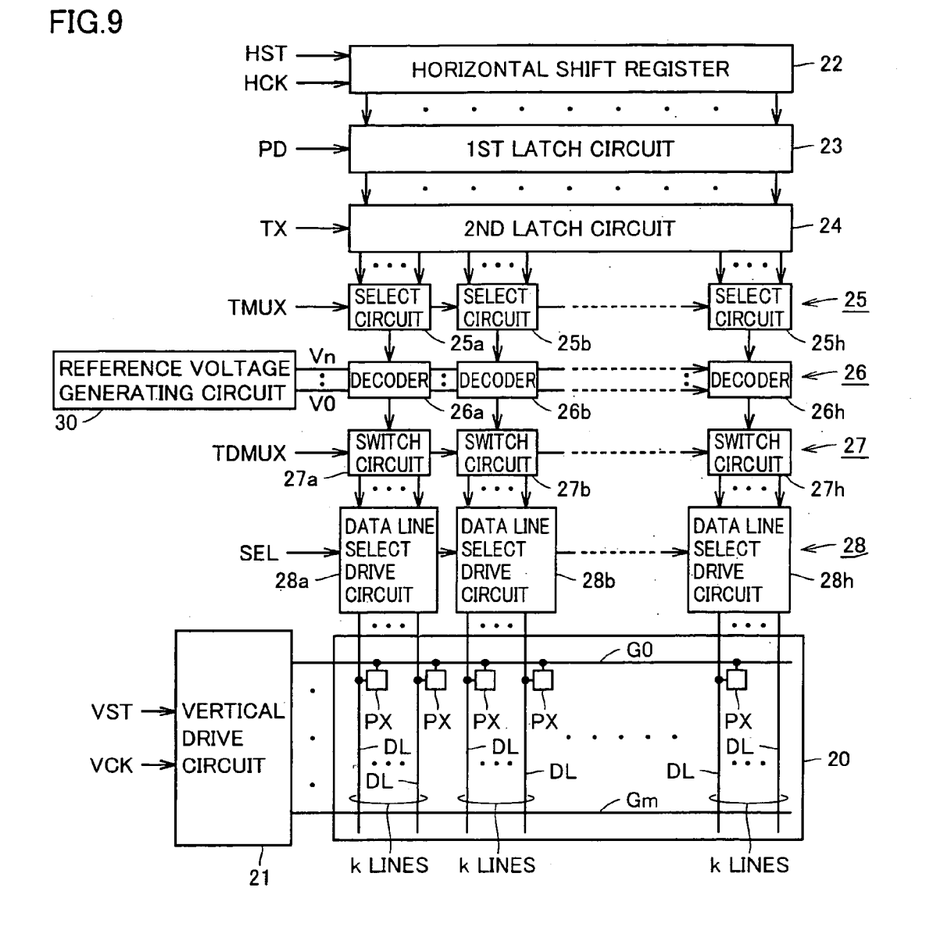
FIG. 9 schematically shows a construction of a main portion of a display device according to a third embodiment of the invention.

FIG. 9 schematically shows a construction of a display device according to a third embodiment of the invention. In FIG. 9, the display device includes a pixel array (display panel) 20 having pixels PX arranged in rows and columns. In the pixel array 20, gate lines G0–Gm are arranged corresponding to the respective rows of pixels PX, and data lines DL are arranged corresponding to the respective columns of pixels PX. FIG. 9 representatively shows pixels PX connected to gate line G0 in pixel array 20. Data lines DL are divided into groups each including the data lines of k in number. This is because the decode operation (digital-to-analog converting operation) is effected in units of sets or groups of the data lines as will be described later.

A vertical drive circuit 21 sequentially drives gate lines G0–Gm to the selected state every horizontal scanning period. Vertical drive circuit 21 receives a vertical operation start instruction signal VST and a vertical shift clock signal VCK. Vertical shift clock signal VCK determines the time period for which gate line G0 is maintained in the selected state.

The display device further includes a horizontal shift register 22 which has outputs corresponding to respective data lines DL, and sequentially drives the outputs to the selected state through a shifting operation according to a horizontal scan start instruction signal HST and a horizontal shift clock signal HCK, a first latch circuit 23 which successively takes in and latches multi-bit pixel data PD according to the output signal of horizontal shift register 22, and a second latch circuit 24 which latches the pixel data latched by first latch circuit 23 according to a transfer instruction signal TX. Each of first and second latch circuits 23 and 24 includes latches arranged corresponding to respective data lines DL and latching pixel data PD for the respective data lines. Second latch circuit 24 may be provided with a level shift function for adjusting the signal amplitude to the decoder performing the analog-to-digital conversion. This level shift is performed for compensating for the difference between the signal amplitude of pixel data PD and the amplitude of the internal pixel write voltage.

The display device further includes a frequency-divided select unit 25 for sequentially selecting the outputs of second latch circuit 24 according to a select control signal TMUX, a digital-to-analog conversion unit 26 for converting the data selected by frequency division select unit 25 to analog data, a frequency-divided switch unit 27 for sequentially switching the transfer paths of the output signals of digital-to-analog conversion unit 26 according to a switch control signal TDMUX, and a data line select drive unit 28 which buffers the electric signal (voltage) provided from frequency-divided switch unit 27 and sequentially selecting the data lines according to a select signal SEL and driving the selected data line according to the buffered voltage.

Frequency-divided select unit 25 includes select circuit 25a–25h arranged corresponding to the k outputs of second latch circuit 24, respectively. Select circuits 25a–25h operate in parallel, and sequentially select the corresponding k outputs of second latch circuit 24 according to control signal TMUX. Select control signal TMUX is produced by frequency-dividing the horizontal shift clock signal HCK. Select circuits 25a–25h have substantially the same constructions as the shift register, and sequentially connect the k inputs to one output according to select control signal TMUX so that a k-to-one multiplexing operation is executed.

Digital-to-analog conversion unit 26 includes decoders 26a–26h arranged corresponding to select circuits 25a–25h, respectively. These decoders 26a–26h are supplied with reference voltages V0–Vn from a reference voltage generating circuit 30 (when the gradation display at (n+1) levels is performed). Decoders 26a–26h have substantially the same constructions as the decode circuit of the first embodiment described previously, select the reference voltages according to the pixel data at the converted level received from corresponding select circuits 25a–25h and achieve the digital-to-analog conversion of the digital pixel data.

Frequency division switch unit 27 includes switch circuits 27a–27h arranged corresponding to respective decoders 26a–26h. Each of switch circuits 27a–27h is formed of a one-input and k-output demultiplexer, and sequentially transmits the analog voltage received on its input to the outputs according to switch control signal TDMUX.

Data line select drive unit 28 includes data line select drive circuits 28a–28h arranged corresponding to respective switch circuits 27a–27h. Each of data line select drive circuits 28a–28h includes an analog amplifier and a data line select gate. The data line select gates are sequentially (in the case of dot-sequential drive) or concurrently (in the case of line-sequential drive) according to select signal SEL, and transmit the voltages applied from switch circuits 27a–27h to data line DL after buffering them by internal analog amplifiers.

The analog amplifiers included in data line select drive circuits 28a–28h are each formed, for example, of an operational amplifier (voltage follower) which receives the transmitted reference voltage at the reference input and feeds back the output to a positive input. These analog amplifiers transmit fast the write voltages (the analog voltages corresponding to the selected reference voltages) with large driving powers.

Switch circuits 27a–27h are formed of analog switches, and transmit the reference voltages (analog voltages) applied from decoders 26a–26h to corresponding data line select drive circuits 28a–28h, respectively.

In the construction shown in FIG. 9, decoders 26a–26h operate in parallel, and therefore are required to perform the decoding operation k times during one horizontal scan period. Accordingly, the decode operation is performed only k times during one horizontal scan period, and a sufficiently long time can be ensured for decoding (digital-to-analog conversion) so that the decode operation can be reliably performed even in the high-definition display device.

Decoders 26a–26h are each formed of the decode circuit similarly to the foregoing first embodiment, and have a reduced number of components. Thus, a sufficient layout area can be ensured for arranging decoders 26a–26h.

Figure 10:
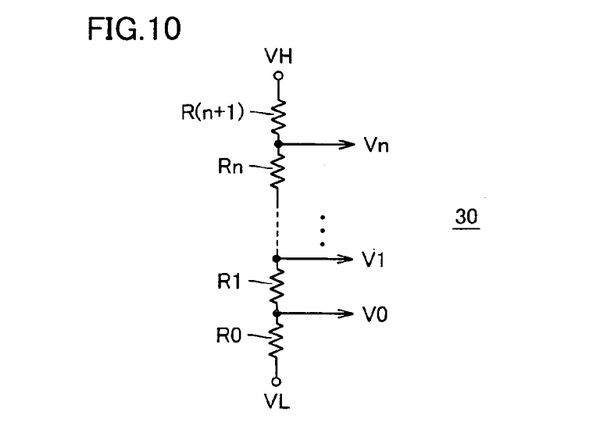
FIG. 10 shows an example of a construction of a reference voltage generating circuit shown in FIG. 9.

FIG. 10 shows an example of a construction of reference voltage generating circuit 30 shown in FIG. 9. In FIG. 10, reference voltage generating circuit 30 includes resistance elements R0–R(n+1) connected in series between a high-side power supply node VH and a low-side power supply node VL. Reference voltages V0, V1, . . . Vn are provided from nodes between the resistance elements. In this reference voltage generating circuit 30, if all resistance elements R0–R(n+1) have the same resistance value, the reference voltage is obtained through resistance division on the voltages between high-side power supply node VH and low-side power supply node VL with the same step.

As an alternative to the construction of reference voltage generating circuit 30 shown in FIG. 10, it is possible to use a construction of a reference voltage generating circuit nonlinearly changing the reference voltage step or a variable reference voltage generating circuit with variable reference voltage steps.

Figure 11:
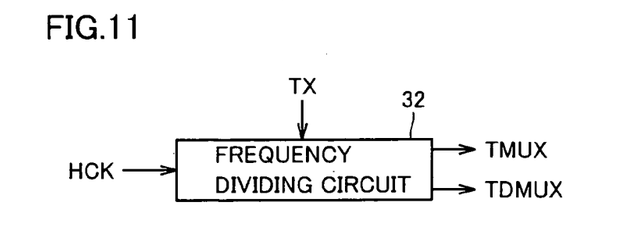
FIG. 11 shows, by way of example, a construction of a portion for generating a select control signal and a switching control signal shown in FIG. 9.

FIG. 11 schematically shows a construction of a portion for generating select control signal TMUX and switch control signal TDMUX shown in FIG. 9. In FIG. 11, select control signal TMUX and switch control signal TDMUX are produced by a frequency dividing circuit 32 that frequency-divides horizontal shift clock signal HCK with a predetermined period. This frequency dividing circuit 32 may produce the frequency-divided signal in response to activation of transfer instruction signal TX instructing the transfer of the pixel data of second latch circuit 24 shown in FIG. 9. Alternatively, select circuits 25a–25h each may be configured to have the selection position reset to an initial position in response to the activation of transfer instruction signal TX. In this case, it is not necessary to supply transfer instruction signal TX as the trigger signal to frequency dividing circuit 32.

Figure 12:
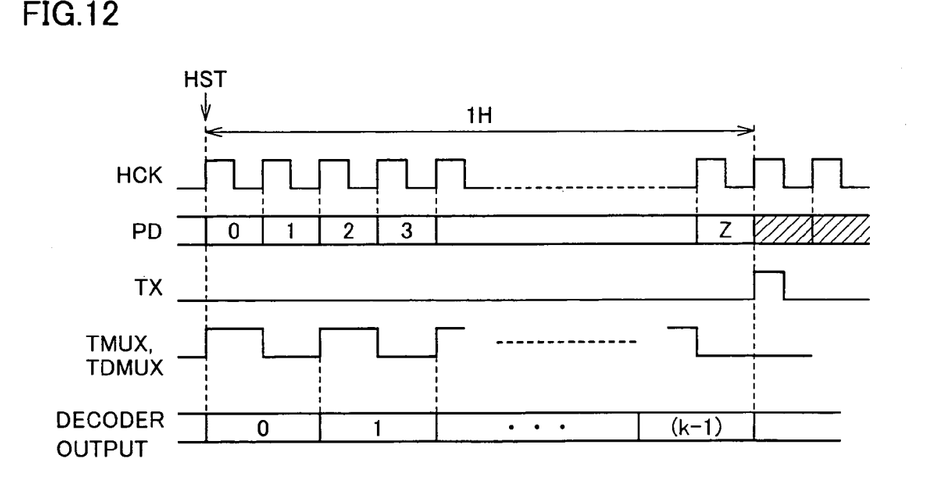
FIG. 12 is a timing chart representing a decode operation of the display device shown in FIG. 9.

FIG. 12 is a timing chart representing an operation of the display device shown in FIG. 9. FIG. 12 shows, by way of example, waveforms for the case where select control signal TMUX and switch control signal TDMUX are produced by halving the frequency of horizontal shift clock signal HCK (when decoders 26a–26h are two in number). The frequency division ratio of select control signal TMUX and switch control signal TDMUX depends on the number of decoders 26a–26h (i.e., the number of decoders is equal to the frequency division ratio).

When horizontal scan start instruction signal HST is received, pixel data PD are successively applied for the next scanning line. According to horizontal scan start instruction signal HST, horizontal shift register 22 shown in FIG. 9 is initialized, and has the selecting position set to the initial position. Then, according to horizontal shift clock signal HCK, horizontal shift register 22 starts the shifting operation from its initial position, and sequentially couples the latches included in first latch circuit 23 to the signal line transmitting pixel data PD. Thereby, pixel data PD(0, . . . , z) are sequentially transmitted in synchronization with horizontal shift clock signal HCK, and are latched by the latches in first latch circuit 23.

When first latch circuit 23 stores the pixel data of one scanning line, transfer instruction signal TX is made active, and first latch circuit 23 transfers pixel data PD to second latch circuit 24.

In parallel with the latching operation of the pixel data of the next scanning line in first latch circuit 23, the pixel data transferred and latched in the previous cycle are converted into the analog voltages in accordance with the latch/output data of second latch circuit 24. Thus, select circuits 25a–25h sequentially select and apply the corresponding outputs of second latch circuit 24 to corresponding decoders 26a–26h according to select control signal TMUX. Decoders 26a–26h select the reference voltages according to the pixel data applied from select circuits 25a–25h, and apply the selected reference voltages to switch circuits 27a–27h, respectively. Switch circuits 27a–27h switch the output paths according to switch control signal TDMUX, and transmit the produced analog voltages (selected reference voltages) to the corresponding data line select drive circuits 28a–28h, respectively.

In data line select drive circuits 28a–28h, the analog buffers (voltage followers) buffer and latch the analog voltages transmitted from corresponding switch circuits 27a–27h. Then, depending on the data line drive scheme, the analog voltages (selected reference voltage) of one scanning line are transmitted according to select signal SEL as pixel write voltages to corresponding data lines DL, and are written into the pixels connected to the selected gate lines.

During one horizontal scanning period 1H, each of decoders 26a–26h performs the decode operation only k times. As shown in FIG. 9, decoders 26a–26h are arranged corresponding to k data lines DL. In this case, the switches which are the components of decoders 26a–26h are reduced in number, and these can be arranged in the display device drive circuit unit with a sufficient margin.

Even when decoders 26a–26h are formed of low-temperature polycrystalline silicon TFTs similarly to the transistors in the pixels, the loads of the output signal lines Since the switching elements are small in number, the layout area is small, and decoders 26a–26h can be arranged corresponding to the pitch of the k data lines with a margin.

According to the above description, each of decoders 26a–26h is arranged for k data lines DL. However, decoders 26a–26h may be arranged corresponding to data lines DL, respectively.

According to the third embodiment of the invention, as described above, the decoders producing the analog voltages for performing the gradation display of the display device are arranged such that one decoder is arranged for each predetermined number of data lines, and the operation frequency (the number times of the decode operations) can be reduced as compared with the case where one decoder is used for performing the decode operation of the pixel data of one scanning line, and the sufficiently long decoding time can be ensured. The decoders each perform the decode operation separately for the upper bit group of the pixel data and for the lower bit group thereof, and require a small occupation area so that the pixel drive circuit of a small occupation area can be achieved, and the display device integrated with the drive circuit can be achieved with a small occupation area.

Pixels PX may be liquid crystal elements, or may be electric field light emitting elements such as organic EL (Electro-Luminescence). The decoder of the invention can be applied to various types of pixels, provided that the brightness of the display pixel is set according to an analog voltage.

The decode circuit according to the invention can be utilized as a usual decode circuit that selects one selection candidate from a plurality of selection candidates. The decode circuit according to the invention can also be applied to circuitry performing digital-to-analog conversion, such as a pixel drive circuit of a reference voltage select type, for generating an analog voltage for gradation display in a display device. Further, the decode circuit according to the invention can be applied to a display device integrated with a drive circuit of a small occupation area for the use in a portable equipment, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Decode circuitry for decoding a multi-bit digital data and outputting an electric signal indicating a decoding result, comprising:

a first bit group decode circuit arranged corresponding to a first bit group of said multi-bit digital data of a multiplicity of bits, and decoding said first bit group, said multi-bit digital data being divided into a plurality of bit groups at least one of which includes plural bits, the bit groups including said first bit group, said first bit group decode circuit including a plurality of first sub-decode circuits arranged corresponding to respective sets each including a plurality of output candidates, and said first sub-decode circuits commonly receiving the bit or bits of said first bit group and each first sub-decode circuit selecting one output candidate from a corresponding set of the output candidates; and a second bit group decode circuit arranged corresponding to a second bit group of said multi-bit digital signal of the multiplicity of bits, and decoding the bit or bits of said second bit group to select an output of said first bit group decode circuit for outputting the electric signal indicating a decode result, said second bit group decode circuit including a plurality of second sub-decode circuits arranged corresponding to the first sub-decode circuits, and commonly receiving said second bit group to select the outputs of corresponding first sub-decode circuits for outputting selected outputs to an output line, respectively, each second sub-decode circuit including a series connection body of switching element or elements provided for the bit or bits of the second bit group and being selectively made conductive in response to the respective bit or bits in said second bit group, the series connection bodies of the second sub-decode circuits being commonly coupled to said output line, and the electric signal indicating said decoding result being supplied to said output line.

2. The decode circuitry according to claim 1, wherein said first bit group includes M data bits, and each of the sets of said output candidates includes the output candidates of the M-th power of 2 in number, and said M is an integer larger than 0, and said second bit group includes N data bits, the first sub-decode circuits are the N-th power of 2 in number, said N is an integer larger than 0, and the second sub-decode circuits are arranged corresponding to said first sub-decode circuits, respectively.

3. The decode circuitry according to claim 1, wherein each set of the output candidates is a set of a plurality of reference voltages at voltage levels each being fixed and different from the others, and the levels of the reference voltages in each of said sets are different from those of the other sets, and one reference voltage at a level corresponding to a value represented by the multi-bit digital data is selected and transmitted to said output line.

4. The decode circuitry according to claim 1, wherein said first bit group is a group of lower bits of said multi-bit-data, and said second bit group is a group of upper bits of said multi-bit data.

5. The decode circuitry according to claim 4, wherein
the output candidates are sequentially arranged in an order of magnitude and are divided into the sets for each predetermined number of the output candidates, and
the second sub-decode circuits are arranged corresponding to the first sub-decode circuits such that said second sub-decode circuits correspond to the sets of the output candidates in an order of magnitude of possible values represented by all the bits of said upper bit group.

6. The decode circuitry according to claim 1, wherein each of the switching elements is formed of a complementary MOS analog switch.

7. A display device comprising:
at least one digital-to-analog conversion circuit for converting display pixel data represented by multi-bit digital data of multiple bits to an analog voltage, said digital-to-analog converter circuit including (i) a first bit group decode circuit arranged corresponding to a first bit group of said multi-bit digital data and decoding said first bit group, said multi-bit digital data being divided into a plurality of bit groups at least one of which includes plural bits, the bit groups including said first bit group, said first bit group decode circuit including a plurality of first sub-decode circuits arranged corresponding to respective sets each including a plurality of output candidates, and commonly receiving the bit or bits of said first bit group, each first sub-decode circuit selecting one output candidate from a corresponding set of the output candidates, and (ii) a second bit group decode circuit arranged corresponding to a second bit group of said multi-bit digital signal of the multiple bits, and decoding the bit or bits of said second bit group to select an output of said first bit group decode circuit and output an electric signal indicating a decode result, said second bit group decode circuit including a plurality of second sub-decode circuits, arranged corresponding to said first sub-decode circuits and commonly receiving the bit or bits of said second bit group, each for selecting an output of a corresponding first sub-decode circuit and outputting a selected output to an output line, each second sub-decode circuit including a series connection body of switching element or elements provided for the respective bit or bits of the second bit group and being selectively made conductive in response to the bit or bits in said second bit group, the series connection bodies of the second sub-decode circuits being commonly coupled to said output line, and the analog voltage signal indicating the decoding result being supplied to said output line;
a plurality of data lines each coupled to a plurality of display pixels; and
a data line drive circuit for driving the data lines according to the analog voltage supplied from said at least one digital-to-analog conversion circuit.

8. The display device according to claim 7, further comprising:
a switch circuit for sequentially selecting and transmitting output voltage signals of said digital-to-analog conversion circuit to said data line drive circuit.

9. The display device according to claim 7, wherein
said digital-to-analog conversion circuit is arranged for each set of a predetermined number of data lines of said plurality of data lines.

10. The display device according to claim 9, wherein
said data line drive circuit is arranged for each set of the predetermined number of data lines, and
said display device further comprising a switch circuit for sequentially selecting and transmitting output voltage signals of a corresponding digital-to-analog conversion circuit to the data line drive circuit of a corresponding set.

* * * * *